US 9,772,447 B2

(12) United States Patent
Keyvaninia et al.

(10) Patent No.: US 9,772,447 B2
(45) Date of Patent: Sep. 26, 2017

(54) METHOD FOR REALIZING HETEROGENEOUS III-V SILICON PHOTONIC INTEGRATED CIRCUITS

(71) Applicants: IMEC VZW, Leuven (BE); Universiteit Gent, Ghent (BE)

(72) Inventors: Shahram Keyvaninia, Tehran (IR); Dries Van Thourhout, Ledebeke (BE); Gunther Roelkens, Schellebelle (BE)

(73) Assignees: IMEC VZW, Leuven (BE); Universiteit Gent, Ghent (BE)

( * ) Notice: Subject to any disclaimer, the term of this patent is extended or adjusted under 35 U.S.C. 154(b) by 0 days.

(21) Appl. No.: 15/147,988

(22) Filed: May 6, 2016

(65) Prior Publication Data

US 2016/0327759 A1    Nov. 10, 2016

(30) Foreign Application Priority Data

May 7, 2015    (EP) ..................... 15166687

(51) Int. Cl.
*G02B 6/12* (2006.01)
*H01L 23/52* (2006.01)
*H01L 29/40* (2006.01)
*H01L 21/00* (2006.01)
*H01L 21/30* (2006.01)
*H01L 21/46* (2006.01)
(Continued)

(52) U.S. Cl.
CPC ..... *G02B 6/12002* (2013.01); *G02B 6/12004* (2013.01); *G02B 6/1228* (2013.01); *G02B 6/14* (2013.01); *H01L 31/1035* (2013.01); *H01S 5/0215* (2013.01); *H01S 5/0218* (2013.01); *G02B 6/12* (2013.01); *G02B 6/34* (2013.01); *G02B 2006/12061* (2013.01); *G02B 2006/12078* (2013.01); *G02B 2006/12107* (2013.01); *G02B 2006/12121* (2013.01); *G02B 2006/12123* (2013.01); *G02B 2006/12142* (2013.01); *G02F 1/01708* (2013.01)

(58) Field of Classification Search
CPC .... G02B 6/14; G02B 6/1228; G02B 6/12002; G02B 6/12004; H01L 24/08; H01L 31/1035; H01S 5/0215; H01S 5/0217; H01S 5/0218
USPC .... 385/14, 131; 257/778, E21.499, E21.503, 257/E33.023, E33.067; 438/108, 455, 438/458, 459, 464, 479, 977
See application file for complete search history.

(56) References Cited

U.S. PATENT DOCUMENTS

| | | | | |
|---|---|---|---|---|
| 2007/0037362 | A1* | 2/2007 | Bahl | ............... H01L 21/2007 438/455 |
| 2011/0221040 | A1* | 9/2011 | Joshi | ............... H01L 21/02002 257/618 |
| 2016/0196972 | A1* | 7/2016 | Basu | ............... H01L 21/02505 257/506 |

OTHER PUBLICATIONS

"Heterogeneous III-V/Silicon Photonics: Bonding Technology and Integrated Devices" by Roelkens, PhD Thesis, 2007.*

(Continued)

*Primary Examiner* — Robert Tavlykaev
(74) *Attorney, Agent, or Firm* — McDonnell Boehnen Hulbert & Berghoff LLP

(57) ABSTRACT

A method of producing a heterogeneous photonic integrated circuit includes integrating at least one III-V hybrid device on a source substrate having at least a top silicon layer, and transferring by transfer-printing or by flip-chip bonding the III-V hybrid device and at least part of the top silicon layer of the source substrate to a semiconductor-on-insulator or dielectric-on-insulator host substrate.

15 Claims, 5 Drawing Sheets

(51) Int. Cl.
*H01S 5/02* (2006.01)
*G02B 6/122* (2006.01)
*H01L 31/103* (2006.01)
*G02B 6/14* (2006.01)
G02B 6/34 (2006.01)
G02F 1/017 (2006.01)

(56) References Cited

OTHER PUBLICATIONS

"Heterogeneously integrated III-V/silicon distributed feedback lasers" by Keyvaninia et al, Optics Letters, vol. 38, No. 24, pp. 5434-5437, 2013.*

* cited by examiner

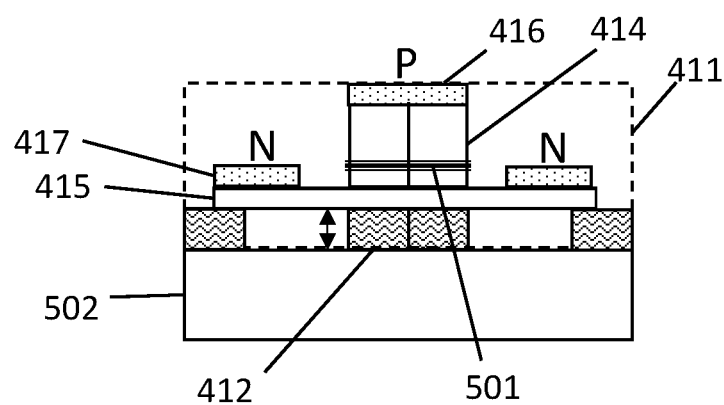
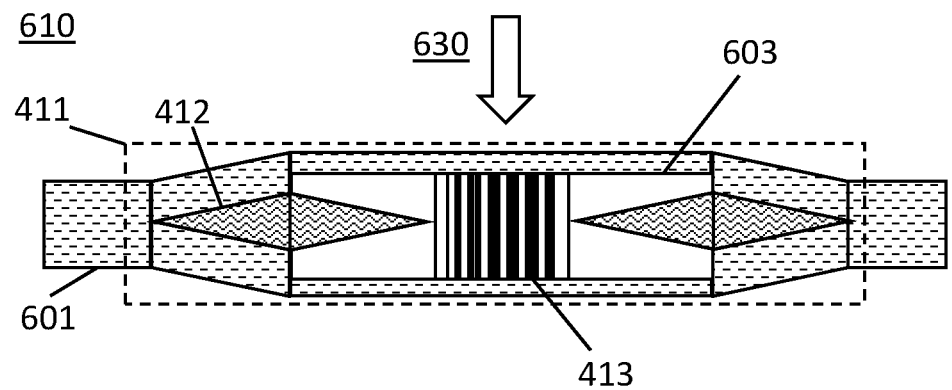
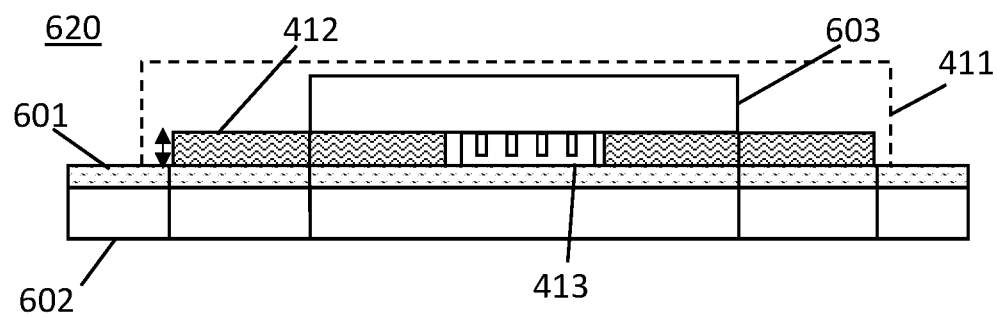
FIG. 6

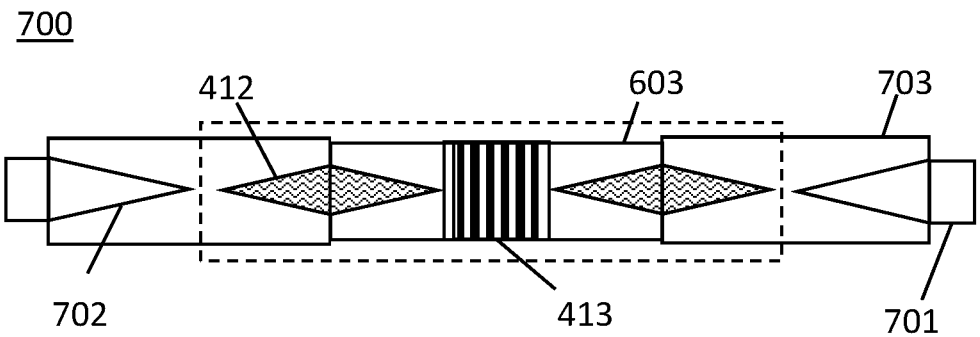
FIG. 7
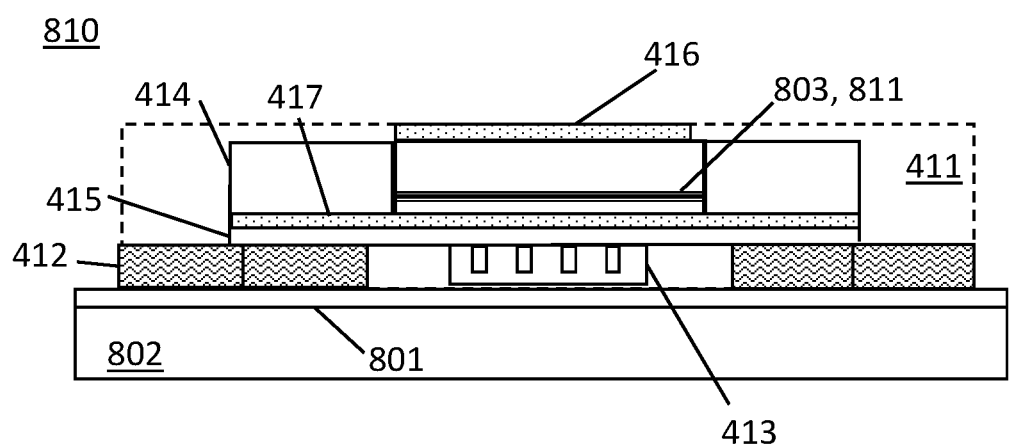
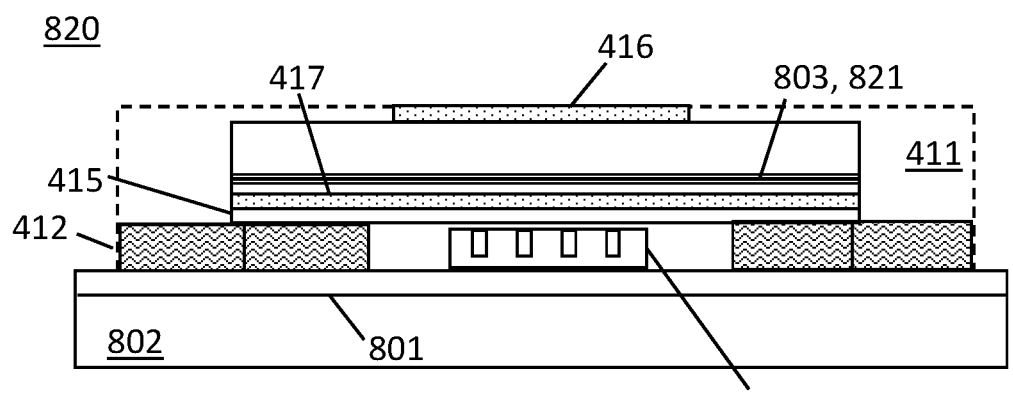
FIG. 8

US 9,772,447 B2

METHOD FOR REALIZING HETEROGENEOUS III-V SILICON PHOTONIC INTEGRATED CIRCUITS

CROSS-REFERENCE TO RELATED APPLICATION

The present application is a non-provisional patent application claiming priority to European Patent Application No. 15166687.2 filed on May 7, 2015, the contents of which are hereby incorporated by reference.

FIELD OF THE DISCLOSURE

This disclosure relates to the field of photonic integrated circuits. More specifically, it relates to methods of manufacturing photonic integrated circuits with integrated hybrid devices, as well as photonic integrated circuits thus obtained.

BACKGROUND

One of the reasons for introducing semiconductor photonics in hardware industry is increasing the speed of data transmission by using photons instead of electrons. In semiconductor photonics, use of silicon is customary due to the low fabrication costs, high yield and high volume driver of already existing microelectronic manufacture plants. Instead of developing a new type of plant and workflow, the existing manufacturing methods are applied to semiconductor photonics, adapting as little as possible, for resources and time economy. This is one of the main reasons of the use of silicon.

While silicon and silicon nitride waveguides are becoming standard materials in photonic circuits, other materials are necessary for good circuit integration. One of the reasons for the need of other materials is the indirect bandgap of silicon, which results in thermal response, rather than photonic response, to an electric stimulus. Hence, laser sources normally need materials with direct bandgap, or at least with better photoemission than silicon. Appropriate materials for production of the active layer of an integrated laser source are the so-called III-V direct bandgap semiconductor materials (GaAs, InP, InGaAs, etc.). For other optical functions, such as optical modulators, III-V materials can be integrated on silicon photonic ICs. Hybrid integration of III-V direct bandgap semiconductor materials or III-V devices with silicon-based integrated circuits is therefore an important technology for obtaining a good photonic integrated circuit, within the industrial constrains of economy of time and resources. The integration strategy followed should provide good optical coupling between the III-V and silicon materials, taking into account the standards of the industry.

One of these industrial standards is the use of silicon-on-insulator (SOI), which presents several advantages, and decades of production have led to a highly optimized production and quality. SOI comprises an insulating thick layer (typically silicon oxide) covered by a thin layer of silicon. Currently, most publicly accessible foundries—more specifically foundries that produce photonic chips—produce photonic SOI device wafers with a silicon thickness of 220 nm. For obtaining good adiabatic coupling of light between a III-V waveguide structure and a silicon waveguide, one should be able to match the effective index of the mode propagating in the silicon and that in the III-V waveguide to allow optical coupling.

In FIG. 1, the effective indices of a waveguide fabricated in a 2 micrometer thick III-V layer stack 101, a 500 nm thick III-V layer stack 102, and a 200 nm thick III-V membrane 103 are represented as a function of their width. The straight lines represent the effective index of silicon slab waveguides for different silicon thickness. For a silicon thickness of 500 nm the effective index is given by the upper most dashed straight line 111, for a 400 nm thickness the effective index is given by the second dashed straight line 112, for a 300 nm thickness the effective index is given by the third dashed straight line 113, and for a thickness of 220 nm the effective index is given by the lowest straight dashed 114. The adiabatic taper coupler should be designed such that the effective index of the silicon waveguide and the effective index of the III-V waveguide cross, which happens for a standard silicon thickness of 220 nm and a 2 micrometer thick III-V waveguide at a width under 0.3 microns. Consequently, if one would wish to use a standard optical silicon platform having a silicon standard thickness of 220 nm, the corresponding III-V layer should be substantially narrower than 0.3 microns, as it can be seen in FIG. 1. This is difficult to realize in practice.

The process for obtaining good coupling hence requires non-standard manufacture of either silicon wafers or III-V waveguides, which is disadvantageous from an industrial point of view. This problem worsens in the case of the silicon nitride platform, where the waveguides have an even lower effective index.

In conclusion, it is desired to have an improved solution for the hybrid integration of III-V waveguide photonic components (such as lasers, amplifiers, modulators) on standard 'thin' silicon photonic platforms and on medium contrast photonic platforms such as silicon nitride based photonic platforms.

SUMMARY

Embodiments of the present disclosure provide a method for producing a photonic integrated circuit with integrated hybrid devices, such that good optical coupling and low optical losses between the hybrid devices and the rest of the photonic circuit occurs.

It is a potential advantage of embodiments of the present disclosure that these combine integrated hybrid devices with a standard silicon or silicon nitride optical platform with a conventional small, e.g. 220 nm, in silicon or 300 nm to 400 nm in silicon nitride thickness, although embodiments are not limited thereto and can also work with other silicon or silicon nitride thickness.

The present disclosure relates to a method of producing a photonic integrated circuit, the method including integrating at least one III-V hybrid device on a source substrate having at least a top silicon waveguide layer, and transferring by transfer-printing or by flip-chip bonding the III-V hybrid device and at least part of the top silicon waveguide layer of the source substrate to a semiconductor-on-insulator host substrate.

It is a potential advantage of embodiments of the present disclosure that this method can be used to solve the problem of the hybrid integration on 'thin' SOI waveguide platforms, even on low contrast materials such as SiNx/SiOx, since by first integrating the hybrid device on a source substrate and then transferring the hybrid device (III-V materials and part of the silicon layer) the radiation coupling requirements to couple to/from the hybrid device can be relaxed. It is a potential advantage of embodiments of the present disclosure that on the source substrate the structures can be dense, allowing to more efficiently use the III-V materials.

The method may comprise providing any or a combination of at least one taper or at least one grating in the top waveguide layer positioned for, in operation, coupling radiation from or to the III-V hybrid device, and transferring at least part of the top waveguide layer may comprise transferring at least part of the top waveguide layer comprising the any or a combination of at least one taper or at least one grating.

It is a potential advantage of embodiments of the present disclosure that at least part of the radiation coupling elements can be made in a waveguide layer of the source substrate, as the semiconductor layer of the host substrate may be unsuitable for generating the full radiation coupling elements or as generating the full radiation coupling elements in the semiconductor layer of the host substrate may induce severe restrictions (or processing requirements) on the III-V hybrid device.

It is a potential advantage of embodiments of the present disclosure that structures may be provided in the source substrate according to the coupling mechanism, such as adiabatic taper waveguides, and the laser design (DFBs, tunable lasers) can be dense, advantageously utilizing the III-V area in the most efficient way. In case of structure design on silicon, structures such wavelength selective feedback (gratings, Distributed Bragg reflector), may be obtained in standard CMOS processing thereby taking advantage of the resolution and the accuracy of lithography tools in CMOS fabs.

Integrating at least one III-V hybrid device may comprise transferring III-V materials to the source substrate, and performing additional processing for forming the hybrid device on the source substrate.

It is a potential advantage of embodiments of the present disclosure that the hybrid device can be finalized sufficiently far so it can be tested on the source substrate, such as prior to being transferred to the host substrate. It thereby is to be noticed that typically electrical testing always can be done, whereas optical testing may depend on the specifics of the component. The latter is especially relevant, as the host substrate may comprise complex and/or costly features that may be degraded if the hybrid device does not operate correctly after transfer to the host substrate. The latter may be avoided by first testing the hybrid device. The method thus results in a higher yield for manufacturing complex heterogeneously integrated photonic integrated circuits. More particularly, in case of a sufficiently processed III-V on the source wafer, the individual hybrid lasers can be tested electrically (or even optically in some cases) before transferring to the host wafer. The malfunctioning devices may be advantageously discarded before finishing the product, reducing the amount of transfers of malfunctioning devices and hence saving material, production costs, and time.

The transferring III-V materials to the source substrate may comprise any of multi-wafer bonding or multi-die bonding, adhesive bonding, molecular bonding, flip chip bonding, or transfer printing. It is a potential advantage of embodiments of the present disclosure that transfer bonding may be performed easily with coarse alignment. Alignment within the range 5 µm to 10 µm or better may be used. The latter may be especially obtainable for III-V materials comprising only active sections.

The top waveguide layer of the source substrate may comprise an adiabatic taper and the III-V material may form a waveguide comprising a passive taper, or the top waveguide layer of the source substrate may comprise an adiabatic taper and the III-V material may form a waveguide comprising an active taper.

The host substrate may comprise a host waveguide and the photonic integrated circuit may comprise a polymer waveguide for coupling radiation between the transferred silicon layer and the host waveguide, or the photonic integrated circuit may comprise a spot converter for coupling radiation between the transferred silicon layer and the host waveguide, or the host substrate and the transferred silicon layer each may comprise diffractive structures, such as gratings, aligned to each other for performing diffraction assisted coupling.

The method may comprise obtaining the host substrate, the host substrate being a semiconductor on insulator substrate or dielectric on insulator substrate comprising a waveguide top layer exhibiting a substantial mismatch in effective index with the III-V waveguide mode, thereby allowing the use of standard substrates.

The method may comprise obtaining the host substrate, the host substrate being a dielectric on insulator substrate comprising a silicon nitride top layer, for instance.

Further, integrating a III-V hybrid device may comprise integrating any of a laser, amplifier, a modulator, or a detector.

The present disclosure also relates to a photonic integrated circuit comprising a host substrate being a semiconductor-on-insulator or dielectric-on-insulator host substrate, and a III-V hybrid device and silicon layer. In one example, the III-V hybrid device is integrated with the silicon layer, and the III-V hybrid device and silicon layer having been transfer-printed or flip-chip bonded on the host substrate together.

The silicon layer may be positioned between the host substrate and the III-V hybrid device in the case of transfer printing. In the case of flip-chip integration, the hybrid device is positioned upside down. The silicon layer may comprise one or a combination of at least one taper or at least one grating positioned for, in operation, coupling radiation from or to the III-V hybrid device.

The silicon layer of the source substrate may comprise an adiabatic taper, and the III-V material may form a waveguide comprising a passive taper, or the silicon layer of the source substrate may comprise an adiabatic taper and the III-V material may form a waveguide comprising an active taper.

The host substrate may comprise a host waveguide and the photonic integrated circuit may comprise a polymer waveguide for coupling radiation between the transferred silicon layer and the host waveguide, or the photonic integrated circuit may comprise a spot converter for coupling radiation between the transferred silicon layer and the host waveguide, or the host substrate and the transferred silicon layer each may comprise diffractive structures, e.g. gratings, aligned to each other for performing diffraction assisted coupling, e.g. grating assisted coupling. In some embodiments, the spotsize converter may be partially formed in the source and partially in the host.

The host substrate may comprise a host waveguide being a dielectric on insulator wafer comprising a silicon nitride top layer, for example.

Particular and preferred aspects of the disclosure are set out in the accompanying independent and dependent claims. Features from the dependent claims may be combined with features of the independent claims and with features of other dependent claims as appropriate and not merely as explicitly set out in the claims as filed.

These and other aspects of the disclosure will be apparent from and elucidated with reference to the embodiment(s) described hereinafter.

BRIEF DESCRIPTION OF THE DRAWINGS

FIG. 5 illustrates a front view of a hybrid device of FIG. 4.

FIG. 6 illustrates top and side views of a hybrid device with no taper in the III-V base and a silicon layer comprising tapers, obtainable according to embodiments of the present disclosure.

FIG. 7 illustrates a top view of a hybrid device and a silicon layer transferred to a host substrate comprising a polymer waveguide assisted spot converter, according to embodiments of the present disclosure.

FIG. 8 illustrates a side view of two hybrid devices, one with active and one with passive tapered structures, transferred to a host substrate, according to embodiments of the present disclosure.

Figure 1:
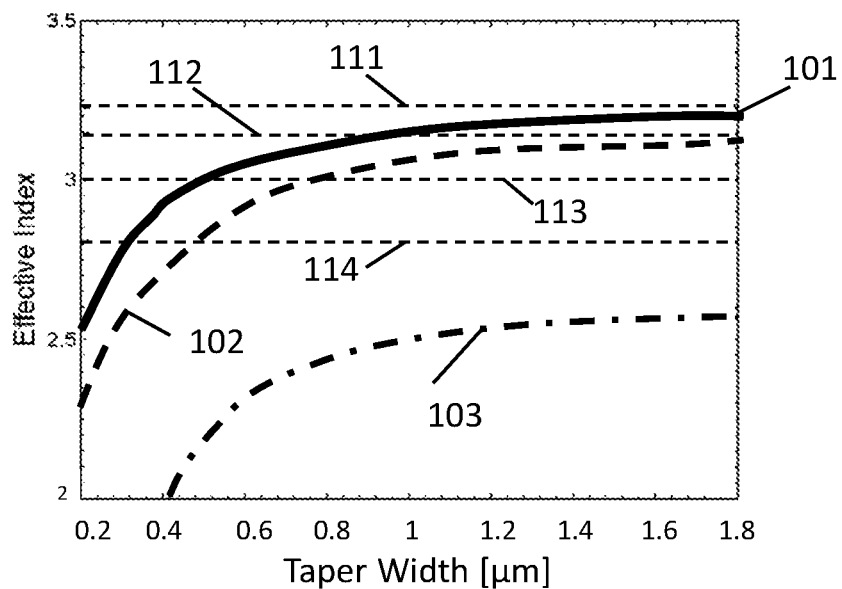
FIG. 1 illustrates a graph showing the effective optical indices of different geometries of III-V waveguides as a function of their width, together with the effective index of a silicon slab layer for different thickness.

The drawings may be considered schematic and are non-limiting unless context dictates otherwise. In the drawings, the size of some of the elements may be exaggerated and not drawn on scale for illustrative purposes. In the different drawings, the same reference signs generally refer to the same or analogous elements.

DETAILED DESCRIPTION OF ILLUSTRATIVE EMBODIMENTS

The present disclosure will be described with respect to particular embodiments and with reference to certain drawings but the disclosure is not necessarily limited thereto. The drawings described are generally schematic and non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising," used herein, should not be interpreted as being restricted to the means listed thereafter; it does not exclude other elements or steps. It is thus to be interpreted as specifying the presence of the stated features, integers, steps, or components as referred to, but does not preclude the presence or addition of one or more other features, integers, steps, or components, or groups thereof. Thus, the scope of the expression "a device comprising means A and B" should not be limited to devices consisting only of components A and B. It means that with respect to the present disclosure, relevant components of the device include A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of example embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

Where in embodiments of the present disclosure reference is made to a "source" or "source substrate" or "source wafer," reference is made to a photonic platform, such as a semiconductor wafer (for example a SOI wafer), onto which III-V material can be attached. The source may be at least partially processed. The III-V material may be at least partially processed on the source. This III-V material may be in the form of a wafer, multi-die or coupons which can be attached to the source.

When reference is made to a "host," reference is made to a photonic platform such as a wafer ("host wafer"), typically a semiconductor-on-insulator substrate, such as for example a silicon-on-insulator substrate or silicon-nitride-on-insulator. According to embodiments of the present disclosure, the hybrid devices may not be directly fabricated on the host but are transferred thereto after the hybrid devices have first been fabricated on the source. Hybrid devices comprise, in particular embodiments of the present disclosure, III-V/silicon materials. The hybrid devices may be passive, or active such as lasers, amplifiers, modulators or detectors, or comprise passive and active elements.

The host or source, or both, may be at least partially processed, for example the source may comprise a waveguide, at least one taper, at least one grating, etc., the host may comprise all necessary photonics components required for rendering it a fully active Si platform. Such components may be introduced upfront and may be introduced using conventional semiconductor processing steps.

Where in embodiments of the present disclosure reference is made to a "tapered structure," reference is made to a wedge, pyramid, cone or other structure comprising a plunged or gradual reduction of size of a waveguide shaped material, for example to improve light coupling. For instance, a taper may be added to an optical waveguide (tapered waveguide) so at least a portion of the waveguide presents good adiabatic coupling with other structures.

The present disclosure relates to methods of manufacturing photonic integrated circuits, or elements or parts thereof. Embodiments of the present method provide good coupling between III-V materials and Si or SiN materials in active or passive photonic circuits, by providing in a first step a good coupling between III-V hybrid devices and Si materials (e.g. Si waveguides) on one platform, and by providing, in a second step, good coupling between silicon on the one hand and silicon or silicon nitride materials on the other hand.

In a first aspect, the present disclosure relates to a method of producing a photonic integrated circuit, the method comprising integrating at least one III-V hybrid device on a source substrate having at least a top waveguide layer (which can be implemented in silicon, silicon nitride or a combination of both materials, or in general a semiconductor or dielectric waveguide layer), and transferring by transfer-printing or flip-chip bonding the III-V hybrid device and at least part of the top waveguide layer of the source substrate to a silicon-on-insulator or silicon-nitride-on-insulator host substrate. The integration is not done directly on the Si/SiN-on-insulator host substrate but makes use of a silicon layer of an intermediate substrate (referred to as the source substrate), thus relaxing the conditions on the thickness of the Si/SiN layer in the host substrate used as photonics platform. Specific features and potential advantages of embodiments of the present disclosure are illustrated below with respect to particular embodiments and illustrative examples.

Figure 2:
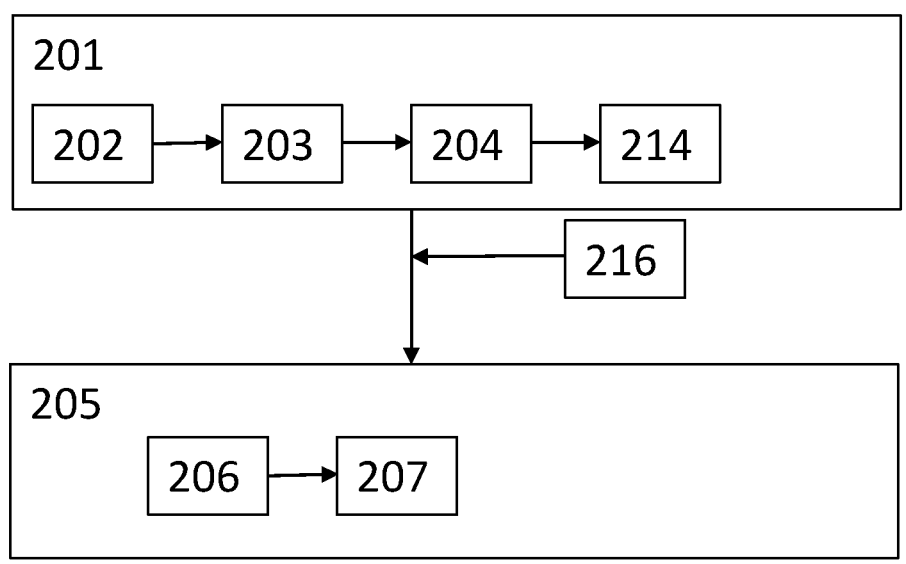
FIG. 2 illustrates a flowchart of methods according to an embodiment of the present disclosure.

FIG. 2 shows a flowchart with some steps or processes according to embodiments of the present disclosure, the present disclosure not being limited thereby, for obtaining an integrated photonics circuit having an integrated hybrid device on a Si or SiN on insulator host substrate. In a first step of the example method of an embodiment of the present disclosure, a hybrid device, comprising III-V material based elements (e.g. wafer, coupon, die, etc.) is integrated 201 on a source substrate. Such an integration process may for example comprise obtaining 202 a "source" photonic platform, which may comprise a silicon waveguide layer, although the present disclosure is not be limited thereto. According to some embodiments of the present disclosure, the source may be a silicon-on-insulator substrate. Obtaining 202 a "source" substrate may comprise obtaining a semiconductor-on-insulator substrate comprising 220 nm thick Si-layer (which together with the semiconductor of the host substrate can result in a sufficiently thick Si layer for relaxing the high requirements on the III-V material layer thickness for adiabatic coupling). Nonetheless, the present disclosure may be applied to any other Si-layer thickness, in particular it can be applied to thicknesses of 300 nm, 400 nm or more, or even to other type of photonic platforms such as hybrid Si/SiN platforms. Hence, the thickness of the silicon layer of the source may be chosen according to the coupling technique, the host material, the thickness of the host, etc. When a taper for adiabatic coupling is provided in the III-V material, a standard epitaxial fabrication 220 nm SOI wafer or a 400 nm SOI wafer can be used. If no tapered structures are to be present in the III-V material, a source substrate with a thickness of at least a 450 nm SOI wafer can be used in order to implement an adiabatic taper using the silicon waveguide layer only. The thickness and type of the host material may also be taken into account when choosing the type of source.

The source substrate may comprise in the top silicon layer any or a combination of at least one taper or at least one grating positioned for, in operation, coupling radiation from or to the III-V hybrid device after the integration of the III-V hybrid device has been done. Such structures thereby typically are intended to be transferred together with the hybrid device towards the host substrate.

The source substrate may comprise wavelength selective feedback elements (like gratings, distributed Bragg reflectors (DBRs), resonant filters) defined in the source. For example, in certain embodiments, the source substrate comprises simple structures, for example adiabatic tapered structures if the coupling mechanism so requires. Alternatively, the source may comprise the filter elements required to make single wavelength, multi-wavelength or tunable laser sources before transferal to the host. In those embodiments the wafer design can be dense so as to use the area of the at least one III-V wafer in the most efficient way.

The integration step also may comprise transferring 203 of III-V material on the source. The III-V material may comprise obtaining a III-V wafer, or a die, or at least one coupon. For example, the III-V material may be made at least one wafer, for example a plurality of wafers, or a III-V material in the form of III-V dies or coupons. In particular embodiments using III-V wafers, one or more III-V wafers may be joined to a SOI wafer by wafer-bonding (by adhesive bonding, or by molecular bonding, for example). This can advantageously done with coarse alignment, depending on the structure, for instance if a passive taper combined with active mesa is prevised, fine alignment (with a tolerance of few microns, for example) can be used.

In some embodiments of the present disclosure, transferring may comprise other suitable techniques, for instance transfer printing or heteroepitaxial growth of III-V material on the silicon source material.

Multi-wafer or multi-die bonding on a full silicon wafer may be done with coarse alignments. Any suitable technique such as adhesive or molecular bonding may be used. In other embodiments, bonding with fine alignment (few microns of tolerance) may be advantageous in the case of selectively (re-)grown semiconductor wafers. For example, in case of active mesa and passive taper integration, the transferal may be advantageously performed with fine alignment.

In other embodiments, dies or coupons may be produced and joined to a source wafer by transfer-printing. For example, coupons may be produced on a III-V wafer, and transfer-printed on a source wafer, for example with the use of an elastomer stamp. Other suitable methods of joining III-V base to a source may be also used, for example flip-chip bonding.

Figure 3:
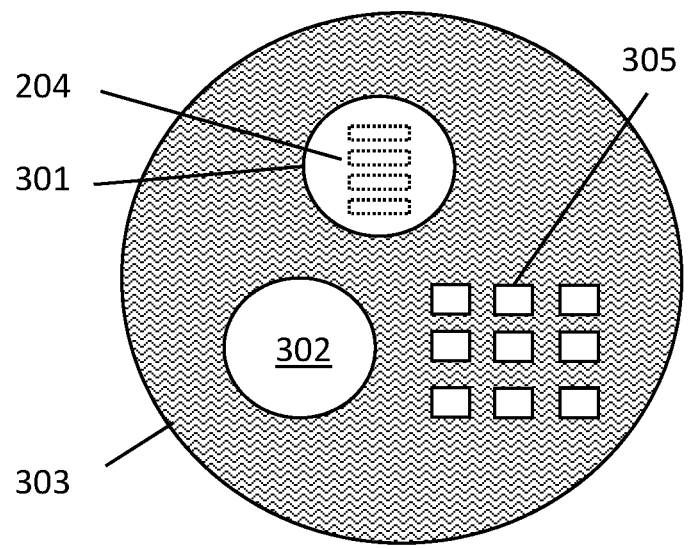
FIG. 3 illustrates a source wafer with different III-V bases after bonding, and illustrating a possible intermediate phase according to an embodiment of the present disclosure.

For example, FIG. 3 shows a III-V wafer 302 joined to a SOI wafer 303, which may comprise gratings, tapered structures, etc. An array of coupons 304 can also be used. A III-V multi-die arrangement 305 may be used.

Whereas in some embodiments, the transferring of III-V material may include at the same time transferring a full III-V based hybrid device, in some embodiments, additional processing of the III-V material on the source substrate is performed to form the III-V based hybrid device. The latter is illustrated by block 204, which may comprise performing any suitable process step. For example, lithographic methods, etching, or any other available processing technique may be applied.

Also, after the hybrid device is formed or is formed partially, post-processing of the device 214, may be performed, for example, in order to render the hybrid device suitable for testing purposes, so it can be tested prior to transferring it.

The hybrid devices may be processed by known lithographic means, by etching, diffusion, etc.

In a following step 205, transferring of the hybrid device and of at least part of the waveguide layer of the source substrate to a host substrate is performed. Such a transfer is performed for both the hybrid device and at least part of the silicon layer simultaneously. Formulated differently, the part of the silicon layer of the source substrate could also be considered as being part of the hybrid device. Using this way of formulation, the hybrid device, including at least part of the silicon layer of the source substrate, is transferred. This transferring step 205 typically comprises the step 206 of obtaining a host substrate, which in embodiments of the present disclosure may be a photonic platform, for example a silicon-on-insulator wafer (such as a 220 nm silicon wafer), a silicon nitride on insulator wafer, or any other suitable platform, which can be a fully active platform. It is a potential advantage of some embodiments of the present disclosure that the host substrate may comprise a conventional semiconductor on insulator layer having a conventional 220 nm thick top semiconductor layer. By using an intermediate substrate for the integration of the hybrid device, the 220 nm thickness is not limiting an efficient adiabatic coupling. After having obtained the host substrate, the hybrid device and at least part of the silicon top layer of the source substrate are transferred 207 to the host, by transfer-printing or flip chip bonding. In the case of transfer printing, the hybrid devices are transferred by separating the coupons from the source (e.g. with an elastomer stamp or with any other suitable means) and transferring them to the host, the present disclosure not being limited thereby. In some embodiments, the hybrid devices may be transferred as one hybrid building block to a fully active photonic platform, e.g. a silicon platform containing modulators and photodiodes with back-end metallization. Providing the host wafer may in some embodiments comprise using the source wafer as a host wafer, for example by obtaining the at least one hybrid device from an area of the source wafer and transfer, e.g. using transfer-printing at least one hybrid device on a different part of the source wafer.

Other processes and steps are not excluded, for example an optional step of electric testing 216 may be performed on the hybrid devices before transferal to the host.

Figure 4:
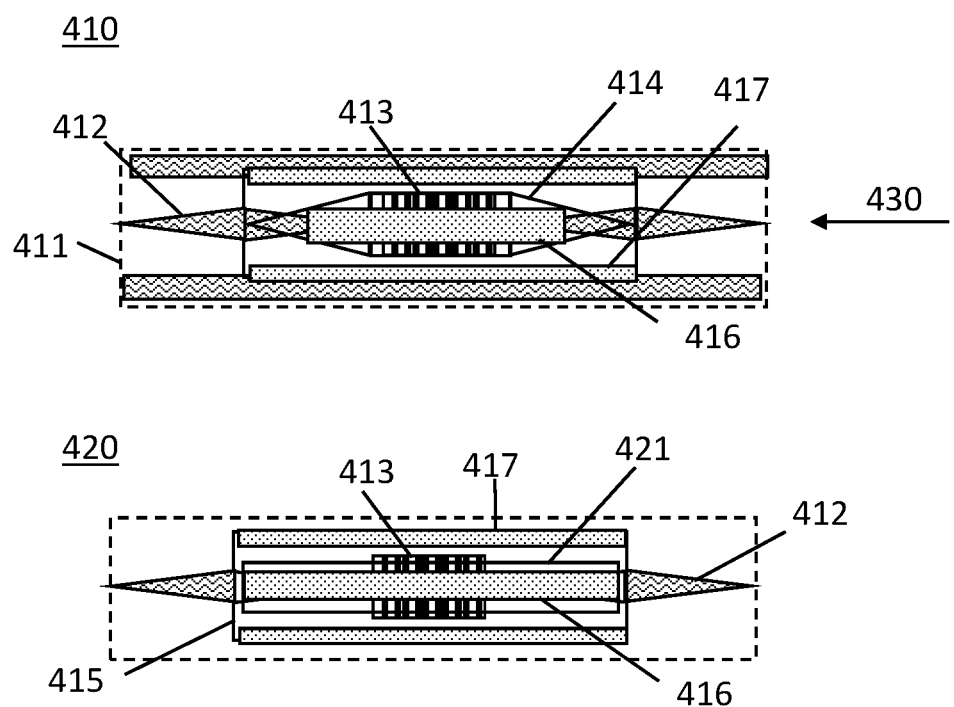
FIG. 4 illustrates a top view of two example hybrid devices and a silicon layer comprising tapers for transferring an optical mode according to an embodiment of the present disclosure.

By way of illustration, embodiments of the present disclosure not being limited thereto, some examples of hybrid devices and parts of the silicon top layer that will be transferred are illustrated in FIG. 4 to FIG. 5.

In one embodiment, the hybrid device is an opto-electronic device whereby the coupling is provided through a tapering in the III-V material and a tapering in the silicon layer initially in the source substrate. The latter is illustrated in FIG. 4 upper drawing illustrating hybrid device and part of the silicon top layer 410 that is to be transferred to the host substrate. The part to be transferred is indicated by reference number 411. The hybrid device comprises a silicon tapered structure 412 at the front and back of the device, a grating 413 covered by a III-V structure 414. In case of the upper drawing 410, the III-V structure 414 is a tapered structure. Another example of a hybrid device is shown in the lower drawing 420, wherein the III-V structure 421 is not tapered. In both cases, on top of the III-V structure, a metal strip 416 forms the P contact, and further metallization strips 417 at each side form the N contacts.

FIG. 5 shows the front view, according to the arrow 430, of the upper drawing 410 of FIG. 4. The metal strip 416 forming the P contact is on top of the tapered structure 414. As an example of embodiments of the present disclosure, the tapered structure may comprise an electro-absorption modulator (EAM), for example formed by multi-quantum wells 501 MQW. The four main parts comprising the hybrid device comprise metallic layers 416, 417, the III-V structure 414, and the platform 415, the silicon layer forming a tapered structure 412, the layer itself having a thickness (indicated by the small double-point arrow) of between 220 nm and 400 nm, or more, and the optional (thin) oxide layer 512 being part of the SOI wafer.

By way of illustration, some examples of transferred devices are shown in FIGS. 6 to 9. In the case of FIG. 6, two views 610, 620 of a hybrid device with no taper in the III-V platform is shown after transferal to the host, in this case a wafer covered by a layer 601 of silicon or silicon nitride on top of a substrate 602 such as silicon oxide. The hybrid device is coupled to the host substrate through a silicon spot converter. This system usually requires fine alignments. The device comprises, as in FIG. 4, a tapered silicon structure 412 made in the part of the top silicon layer that is transferred from the source substrate. The tapered portions are positioned in the front and back of the hybrid device. Furthermore a grating 413 and a III-V base structure 603 is also provided, which in this case does not comprise tapers and which may be fully or partially processed. The transferred hybrid device and at least part of the silicon layer are shown positioned on the surface layer 601 of the host, for example a host SOI wafer, or for example a hybrid SiN/Si wafer. Depending on the thickness of the transferred at least part of the silicon layer of the source substrate, the thickness of the high refractive index semiconductor layer of the host substrate may be 220 nm, 380 nm, or others. The III-V structure may present no taper if the thickness of the at least part of the source silicon layer and of the semiconductor host layer surpasses 450 nm. The lateral profile 620 (corresponding to the view of the upper drawing 610 according to the arrow 630) shows the grating 413, the transferred silicon layer 412 (which, as in the case of FIG. 4, may have a thickness of 220 nm or more), the transferred III-V base 603 and the host, which may comprise a layer 601 of silicon or Si/SiN on top of a substrate 602 (e.g. a silicon oxide substrate).

The coupler may be a polymer waveguide (or other dielectric material)-assisted spot converter, which is less sensitive to alignment. For example, in FIG. 7, a polymer waveguide-assisted coupler is shown. It comprises a hybrid device comprising a taper in the III-V base 603 such that the mode is in the silicon within the hybrid device, and the already presented grating 413 and tapered silicon structures 412. The transferred hybrid device and at least part of the source silicon top layer are positioned on the host substrate 701, in this particular embodiment a host waveguide formed in the host substrate comprises tapered structures 702 so that coupling of radiation can occur via the polymeric waveguide 703. The host substrate 701 may be a 220 nm semiconductor on insulating wafer or a silicon nitride wafer, for example a 300 nm silicon nitride, the present disclosure not being limited thereto. The source wafer may have a silicon thickness of 400 nm.

Another coupler is shown in FIG. 8, corresponding to the lateral view of two possible hybrid devices 810, 820 (several features can be identified in the corresponding embodiments 410, 420 of FIG. 4). They may comprise an encapsulating matrix 411. The upper drawing 810 represents a hybrid device comprising an active III-V base structure 811, for example active via MQW 803, and passive III-V tapered structure 414, although the tapers may also be active. The lower device 820 comprises active III-V base structure 821 and no tapered structures in the III-V material. The rest of the structure comprises, as before, metal contacts 416, an optional III-V platform 415 with metal contacts 417 on top, and (transferred) silicon tapers 412, grid 413, and finally the host wafer comprising for example a silicon layer 801 and silicon oxide 802, which may have a variety of shapes and may comprise complex circuits. The hybrid device and the host can be joined by transfer-printing.

Figure 9:
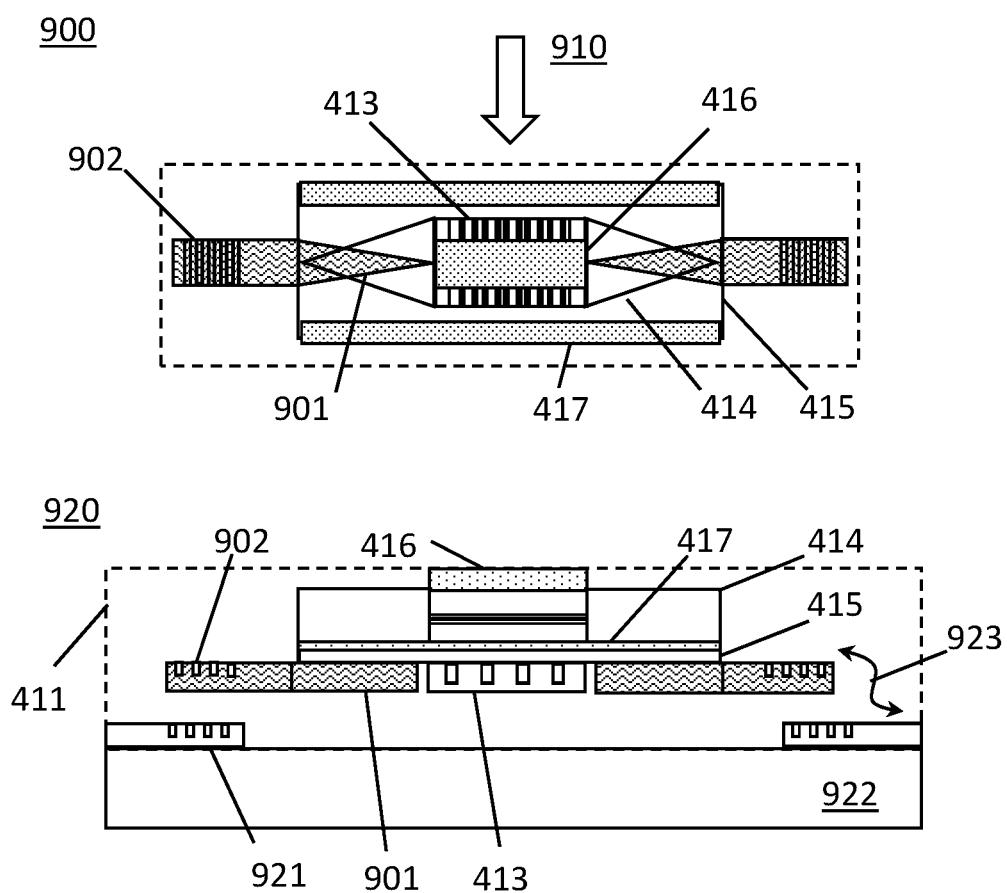
FIG. 9 shows top and side views of a device with grating coupling to a host substrate, according to embodiments of the present disclosure.

The present disclosure is not limited to the described structures, and it can be suitably adapted for manufacture of other type of structures requiring different coupling mechanisms. For example, it can be applied to devices using grating-assisted coupling, by producing a grating coupler on the transfer hybrid device and another in the host. FIG. 9 shows the top view of a hybrid device (a coupon 900) and the lateral view (following the arrow 910) of the finished device 920, after attachment of the hybrid device to a host. In this particular embodiment, the coupon may comprise as before a III-V structure 415, which may be tapered or non-tapered, and may be active or passive, or may be active with passive tapers. The III-V structure 414 covers a grating 413. The silicon structures transferred from the source comprise a taper 901 and a grating 902, instead of the previous tapered structure 412. The lateral view (according to arrow 910) of the complete device 920 shows the hybrid device and the host encapsulated by the matrix 411, the grating 413, contacts 416 and 417 on the structure 414 and platform 415, and the transferred silicon structures comprising a taper 901 and grating 902. The grating 902 of the hybrid device can be aligned to host gratings 921. These gratings may be deposited, processed or suitably produced on the surface of the host substrate 922, which may be a SOI wafer, or a layer of silicon nitride on a silicon oxide substrate, etc.

The coupling is done through grating couplers in the silicon, following the double arrow 923. The present disclosure allows also the production of integrated devices comprising taper coupling or grating coupling, which can follow an out-of-plane scheme, increasing design flexibility and requiring less accuracy, and allowing stacked structures, for instance. In the presented scheme the integration on the host wafer is carried out using transfer printing. In an alternative embodiment, the integration is done through flip-chip integration, in which case the hybrid device is mounted upside down. The latter may especially be used when using diffractive structures, e.g. grating couplers, for coupling radiation between the silicon layer of the source and the silicon layer of the host.

The choice of coupling mechanism determines the type of structure and layer thickness of the source, base and host, as well as the type of bonding between them. In an example embodiment of the present disclosure comprising a laser, the laser may present a coupling mechanism on the III-V and Si waveguide using adiabatic taper coupling, for example. Alternative coupling scheme comprise for example evanescent coupling. The adiabatic coupling however stands out in terms of optical bandwidth. The adiabatic taper may be an active taper, which is advantageous in case of a wafer bonding approach for the attachment of the III-V to the source wafer as it only needs coarse alignment. It may also be a passive taper on III-V waveguide, which may be integrated on the source wafer by transfer printing of III-V epitaxial coupons containing both active and passive sections. This coupling method advantageously presents lower loss. The taper coupling may be applied both on silicon and on the III-V die.

In certain embodiments of the present disclosure in which the total thickness of the source silicon and the host silicon is higher than 450 nm, adiabatic coupling can be advantageously obtained using tapered structures only on the silicon, with no need of the III-V tapering.

In a second aspect, the present disclosure relates to a photonic integrated circuit comprising a host substrate being a semiconductor on insulator host substrate, a hybrid device and silicon layer, the III-V hybrid device being integrated with the silicon layer and the III-V hybrid device and silicon layer having been transfer-printed or flip-chip bonded on the host substrate together. The silicon layer typically comprises one or a combination of at least one taper or at least one grating positioned for, in operation, coupling radiation from or to the III-V hybrid device. It is a potential advantage of embodiments of the present disclosure that, by introducing at least part of the coupling mechanism in a silicon layer originally not being part of the host substrate, standard host substrates can be used, such as for example a semiconductor on insulator substrate with a 220 nm top semiconductor layer. A variety of different coupling mechanisms may be used in the photonics integrated structure for coupling radiation out of the hybrid device.

In one example, the top silicon layer of the source substrate comprises an adiabatic taper without further tapering being present.

In another example, the top silicon layer of the source substrate comprises an adiabatic taper and the III-V material forms a waveguide comprising a passive taper.

In yet another example, the top silicon layer of the source substrate comprises an adiabatic taper and the III-V material forms a waveguide comprising an active taper.

Also for coupling radiation towards the host substrate, a variety of coupling mechanisms can be used.

In one example, the photonic integrated circuit comprises a polymer or other dielectric material waveguide for coupling radiation between the transferred silicon layer and the host waveguide.

In another example, the photonic integrated circuit comprises a spot converter for coupling radiation between the transferred silicon layer and the host waveguide.

In yet another example, the host substrate and the transferred silicon layer each comprise gratings aligned to each other for performing grating assisted coupling.

As indicated above, when describing the method of producing the photonics integrated circuit, the host substrate may for example be a semiconductor on insulator substrate, e.g. a silicon on insulator substrate, or a silicon nitride on insulator substrate. The thickness of the top semiconductor layer can advantageously be limited to e.g. 220 nm so that standard substrates can be used, although this is not strictly required. Further features and advantages of embodiments of photonics integrated circuits may be as set forth in the first aspect.

What is claimed is:

1. A method of producing a photonic integrated circuit, the method comprising:
   integrating at least one III-V hybrid device on a source substrate having at least a top silicon waveguide layer; and
   transferring, by transfer-printing or by flip-chip bonding, the III-V hybrid device and at least part of the top silicon waveguide layer of the source substrate to a semiconductor-on-insulator host substrate.

2. The method of claim 1, further comprising providing one or more of at least one taper or at least one grating in the top silicon waveguide layer positioned for, in operation, coupling radiation from or to the III-V hybrid device, and wherein transferring at least part of the top silicon waveguide layer comprises transferring the one or more of the at least one taper or the at least one grating.

3. The method of claim 2, wherein the top silicon waveguide layer of the source substrate includes an adiabatic taper, and the III-V hybrid device comprises a waveguide including a passive taper or an active taper.

4. The method of claim 1, wherein integrating at least one III-V hybrid device comprises transferring III-V materials to the source substrate, and performing additional processing for forming the hybrid device on the source substrate.

5. The method of claim 4, wherein transferring III-V materials to the source substrate includes any of multi-wafer bonding or multi-die bonding, adhesive bonding, molecular bonding, flip chip bonding, or transfer printing.

6. The method of claim 1, wherein the host substrate comprises a host waveguide, and wherein:
   the photonic integrated circuit comprises a polymer waveguide configured to couple radiation between the transferred silicon waveguide layer and the host waveguide, or
   the photonic integrated circuit comprises a spot converter configured to couple radiation between the transferred silicon waveguide layer and the host waveguide, or
   the host substrate and the transferred silicon waveguide layer each comprise diffractive elements aligned to each other and configured perform diffractive assisted coupling of radiation between the transferred silicon waveguide layer and the host waveguide.

7. The method of claim 1, further comprising obtaining the host substrate, the obtained host substrate being a semiconductor-on-insulator substrate, or a dielectric-on-insulator substrate comprising a waveguide top layer exhibiting a substantial mismatch in effective index with the III-V waveguide mode, thereby allowing the use of standard substrates.

8. The method of claim 1, further comprising obtaining the host substrate, the obtained host substrate being a dielectric-on-insulator substrate comprising a silicon nitride top layer.

9. The method of claim 1, wherein integrating a III-V hybrid device comprises integrating any of a laser, amplifier, a modulator, or a detector.

10. A photonic integrated circuit comprising
    a host substrate being a semiconductor-on-insulator or dielectric-on-insulator host substrate, and including a host waveguide; and
    a III-V hybrid device and silicon layer, the III-V hybrid device being integrated with the silicon layer, and the III-V hybrid device and silicon layer having been transfer-printed or flip-chip bonded on the host substrate together such that, in operation, radiation is coupled between the transferred silicon layer and the host waveguide.

11. The photonic integrated circuit of claim 10, wherein the silicon layer has been transfer printed, and wherein the silicon layer is positioned between the host substrate and the III-V hybrid device.

12. The photonic integrated circuit of claim 10, wherein the silicon layer comprises one or more of at least one taper or at least one grating positioned to, in operation, couple radiation from or to the III-V hybrid device.

13. The photonic integrated circuit of claim 10, wherein the silicon layer comprises an adiabatic taper, and the III-V material forms a waveguide comprising a passive taper or an active taper.

14. The photonic integrated circuit of claim 10, wherein the host substrate comprises a host waveguide, and wherein:
    the photonic integrated circuit comprises a polymer waveguide configured to couple radiation between the transferred silicon layer and the host waveguide; or
    the photonic integrated circuit comprises a spot converter configured to couple radiation between the transferred silicon layer and the host waveguide; or
    the host substrate and the transferred silicon layer each comprise gratings aligned to each other and configured to perform grating assisted coupling of radiation between the transferred silicon layer and the host waveguide.

15. The photonic integrated circuit of claim 10, wherein the host substrate comprises a host waveguide being a dielectric-on-insulator wafer comprising a silicon nitride top layer.

* * * * *